United States Patent

Bell

[15] 3,675,043

[45] July 4, 1972

[54] HIGH SPEED DYNAMIC BUFFER

[72] Inventor: Anthony Geoffrey Bell, 6718 De Moss 069, Houston, Harris County, Tex.

[22] Filed: Aug. 13, 1971

[21] Appl. No.: 171,654

[52] U.S. Cl. ............................307/205, 307/251, 307/214, 307/208

[51] Int. Cl. ....................................................H03k 19/08

[58] Field of Search ..................307/205, 208, 251, 279, 304, 307/214

[56] References Cited

UNITED STATES PATENTS 3,560,764 2/1971 McDowell..........................307/205 X 3,588,537 6/1971 Brink ...............................307/205 X

OTHER PUBLICATIONS

IBM Tech. Disc. Bulletin, Vol. 12, No. 12, May 1970, p. 2082, " FET Decoder Circuit" by Linton et al.

*Primary Examiner*—John S. Heyman

*Attorney*—Harold Levine et al.

[57] ABSTRACT

Disclosed is a high speed insulated gate field effect transistor output buffer circuit integrated on a monolithic clip utilizing novel voltage drive circuitry. The circuit combines high speed with low operating voltages to provide a bipolar TTL compatible circuit.

18 Claims, 8 Drawing Figures

INVENTOR
ANTONY G. BELL

BY Richard L Donaldson

ATTORNEY

HIGH SPEED DYNAMIC BUFFER

This invention relates to IGFET output buffer circuits in general, and more specifically to IGFET output buffer circuits compatible with bipolar TTL circuitry and which utilize selective voltage superposition to increase the internal drive capacity.

In integrated circuit technology output buffers are utilized to provide a power conversion interface so that the integrated circuit having a relatively lower power driving capacity can operably drive a circuit which has the capacity to drive the higher power external load circuit. An example of this is an IGFET shift register driving a bipolar TTL load.

An IGFET shift register on a single chip can be broken into three basic sections:an input interface, an internal delay line, and an output interface or buffer.

An input interface provides a power conversion interface which converts lower operating voltages of the external, off-the-chip circuitry to the relatively higher working voltages of the internal delay line. An internal delay line is comprised of a series of cells gated by a miltiphase clock system. If a cell is designed, for example, with a two phase clock then the data will transfer through one-half of the cells upon the first clock going to a logical 1 state, and then the data will transfer through the second half of the cell upon the second clock going to a high state. An example of a typical functional cell would be an IGFET inverter stage between two IGFETs which are used as gating means. The first IGFET may have clock 1 connected to its gate and the second IGFET may have clock 2 connected to its gate. A second IGFET inverter stage would then be connected to the output terminal of the second IGFET gating means.

The output interface may be a progression of cells of the same basic structure as that of the internal delay line element with a gradual increase of power, until the level is high enough to drive the external circuit. If the external drive is current, a single output device may be used, driven by a high power capacity version of the basic cell structure. If a voltage output drive is needed, an external load resistance can be provided in the current drive circuitry. To retain sufficient speed and yet provide the required drive capacity, push-pull, boot strap configuration is conventionally used.

A conventional push-pull configuration may be a pair of IGFETs connected in series, having gates connected to a boot strap drive circuit which provides complementary signals, such that when one of the IGFETs is conductive the other is non-conductive. The output terminal of this series push-pull configuration would be at the common source-drain connection. This configuration allows a relatively higher speed, as each IGFET is conductive only when the other is non-conductive, thus allowing the non-conductive IGFET to switch substantially zero current from the other IGFET when it becomes conductive.

As the speed requirement of the external circuit interfacing with the output buffer increases, it becomes more difficult to obtain a voltage drive sufficient for the push-pull configuration and still maintain high speed performance. The conventional boot strap IGFET circuit is limited in frequency by the switching characteristics of the IGFET pair, and when designed to drive bipolar TTL circuitry the geometry of the output boot strap circuit may become prohibitively large. This problem becomes amplified when use is also made of a low $V_t$ IGFET manufacturing process which allows low operational voltages on the chip.

Accordingly, it is an object of the present invention to produce an improved IGFET output buffer which will function at high speed and be bipolar TTL compatible.

It is a further object of the present invention to produce an IGFET output buffer circuit having a power capacity for driving TTL circuits and also having an increased packing density.

Briefly, and in accordance with the present invention, a dynamic IGFET output buffer circuit having an input stage and an output stage is integrated on a monolithic chip. The output stage of the buffer is a push-pull, boot strap configuration employing a precharge technique to selectively charge a parasitic capacitance at preselected nodal points in the circuit. An input signal is impressed upon the first stage of the output buffer, which is a non-inverting one bit delay circuit in parallel with an inverting one-half bit delay circuit. The signals from these circuits provide the drive for setting the desired state of the output circuitry of the buffer.

The novel features believed to be characteristic of this invention are set forth in the appended claims. The invention itself, however, as well as other objects and advantages thereof may best be understood by reference to the following detailed description when read in conjunction with the accompanying drawings wherein:

FIG. 1 schematically depicts an output buffer circuit in accordance with one embodiment of the present invention;

Figure 1:
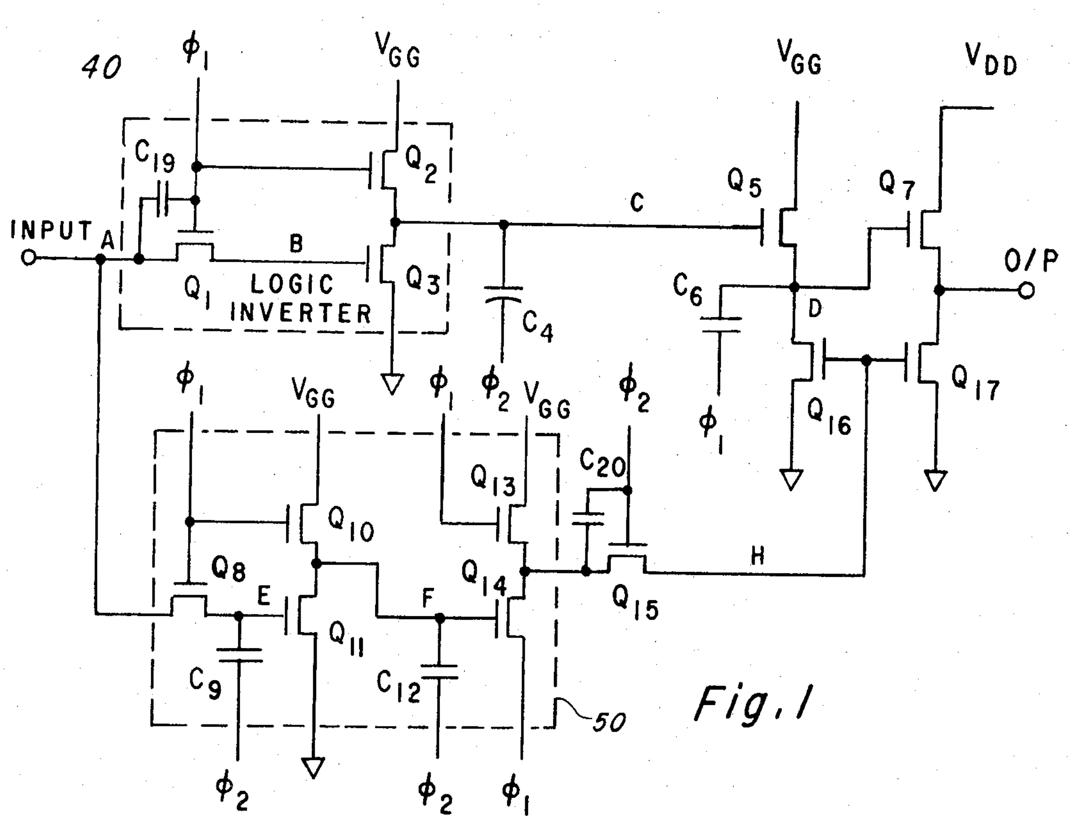
Figure 2:
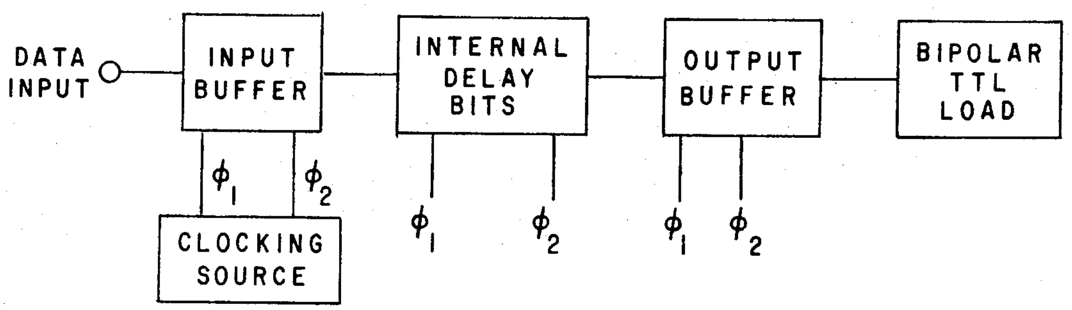
FIG. 2 is a block diagram of a shift register embodying the output buffer of the present invention to a drive TTL load.

The output buffer of the present invention is shown schematically in FIG. 1. FIG. 2 depicts in block form a shift register circuit employing the output buffer driving a TTL load. Data input logic levels are gated into the input buffer 62 by clocking inputs $\phi 1$ and $\phi 2$ hereafter also referred to as gating inputs. Data from the input buffer is transferred to internal delay bits 65 of a predetermined length. This predetermined length may be any desired length in accordance with manufacturing processes presently known to those skilled in the art. The data ripples through the internal bits in accordance with the cell design and clocking scheme utilized, such as earlier described. The output buffer 70 then receives the delayed signal, which is then gated with clocks $\phi 1$ and $\phi 2$. This gated signal is then used to trigger circuitry in the buffer which provides drive to the output transistors of the buffer. These transistors then supply the necessary capacity to drive the TTL load. Typical requirements of a TTL load are shown below in TABLE 1, shown in negative logic for p-channel devices.

TABLE 1

1. Logic zero of less than 1.0 volts with respect to IGFET circuit ground. ($V_{substrate}$ minus Substrate Voltages) while delivering a current of approximately 100 micro-amps.
2. Logic 1 of less than 0.4 volts with respect to a nominal 5.0 voltage supply while dissipating a current of approximately 2.0 milli-amps.
3. Data to be available 50 nanoseconds from the leading-edge of the gating signal and remain until the next gating signal pulse.
4. A capacitive load of about 20 picofarads.

FIG. 1 shows an output buffer in accordance with the present invention and compatible with TTL requirements. This circuit may be described generally with reference to the block diagram in FIG. 2. The input signal passes simultaneously through an inverting logic delay amplifier 40 and through a non-inverting delay amplifier 50. The output node C of the logic inverter 40 is connected to the gate of transistor Q5 which couples a first voltage supply $V_{GG}$ to the transistor Q16. The gate of transistor Q5 is capacitively coupled to a gating signal $\phi 2$. The node D comprising the common source drain connection of transistors Q5 and Q16 is capacitively coupled to clock $\phi 1$ and is also connected to the gate of transistor Q7. The source-drain circuit of transistor 7 is connected in series between a supply $V_{DD}$ and a fourth transistor Q17, the output 60 being taken from the common source-drain connection. The gate of transistor Q17 is commonly connected with the gate of transistor Q16. These common gates are both connected to gating transistor Q15 which has the phase two clock connected to its gate. Capacitor C20 couples the drain of transistor Q15 with its base and the phase two clock. The output of the non-inverting delay amplifier, node G, is connected to the drain of said transistor Q15.

Operation of the output buffer in accordance with the preferred embodiment of FIG. 1 is as follows. Assuming $\phi 1$ becomes a logical 1 when a logic 1 is at the input node A, then the 1 is transferred to node B through Q1. The logic 1 voltage of the input signal at node A is increased by the superposition of the $\phi 1$ voltage waveform through capacitor C19. As $\phi 1$ is also impressed upon the gate of transistor Q2, Q2 then becomes conductive; as node B goes high, Q3 becomes conductive driving node C low, i.e., towards circuit ground.

During the time the input signal propagates through this inverting one-half bit delay amplifier circuit it is propagating through the one bit delay non-inverting amplifier circuit 50. When $\phi 1$ goes to a logical 1 this drives transistors Q8 and Q10 to the "on" state. The high level input signal then propagates through transistor Q8 to node E, and node E, being high, then turns transistor Q11 on, driving node F low. Q14 becomes non-conductive, as the logical 1 of $\phi 1$ is impressed upon its drain. Thus, as Q14 has been turned off by the high of $\phi 1$, the node G is high. At the moment $\phi 1$ goes low and before $\phi 2$ goes high, the following conditions are present: nodes B, E and G are high; nodes C and F are low; nodes D and H are dependent upon previous data bits, that is, nodes D and H are the controlling nodes for the previous data output state, and this state is capacitively stored until the new data ripples to these nodes from the input of the buffer.

As $\phi 2$ becomes a logic 1, node C tries to rise with the leading-edge of the $\phi 2$ voltage waveform, but the low "on" resistance of Q3 prevents a significant voltage rise and prevents Q5 from turning on. The high logic level of node G is rapidly transferred to node H, as the logic 1 of $\phi 2$ is impressed upon the gate of Q15. Then as node H goes high Q16 and Q17 turn on. If node D was previously high, and consequently causing the output 60 to be high, Q16 and Q17 discharge these nodes to approximately zero volts. Thus when $\phi 2$ goes low, the following conditions remain: B, E, G and H are high, nodes C, D and F are low. The input node A now has received a new logical data bit on it.

Assume now that the new data at node A is a logical 0 at the time that $\phi 1$ goes high. For this situation after $\phi 1$ subsequently goes low a logic transfer results and the following condition: nodes B, G and E are low, nodes C, F and H are high, node D is at a low voltage as Q16 has been turned on. The output node remains low since the voltage on D is not sufficient to turn Q7 on to any significant extent, due to transistor Q16 being turned on.

When $\phi 2$ now goes high, node C rises in voltage with the same rise time as voltage waveform $\phi 2$ to a higher voltage (greater than $V_{GG}$). Thus as the gate of transistor Q5 has been driven to a voltage higher than the voltage on the drain of Q5, Q5 fully saturates, charging node D towards $V_{GG}$ in voltage. This circuit action is distinguished from conventional circuit action in that the gate of Q5 conventionally has not been biased by an external source to a voltage higher than $V_{GG}$. Correspondingly, node D conventionally would not rise to an approximate $V_{GG}$ voltage. Meanwhile, as Q15 turns on due to $\phi 2$ impressed upon its gate, the previous logic 1 at node H is discharged to a low value and allows node D the freedom to rise to a logical 1, as transistors Q16 and Q17 are turned off by node H going low. As the voltage at node D rises, transistor Q7 begins turning on, and the output begins rising toward $V_{GG}$. Thus a logic 1 has been transferred to the output.

The voltage at node D supplying drive for output transistor Q7, as caused by a logic 1 impressed upon node C, is important. Unless a high voltage at node D can be available, output transistor Q7 becomes prohibitive in size. If Q7 is to have the capacity to be bipolar TTL compatible, assuming typical operating conditions such as $V_{DD}$ equal to minus 5.5 volts and $V_{GG}$ equal to minus 15 volts with an output sink current of minus 2.0 milli-amps and a $V_t$ of 2.5 volts, then a voltage of approximately −10 volts at node D (as would be supplied with conventional circuitry) would require an output transistor of approximately 193 mils by 0.4 mils. Using the embodiment of the present invention where node D rises to approximately −15 volts due to the impression of the $\phi 2$ voltage upon node C, an output transistor Q7 of approximately 40 mils by 0.4 mils will suffice to sustain the bipolar TTL requirements. In accordance with the present invention the gates of transistors Q11 and Q14 are also driven higher than a logic 1 to increase circuit speed. Similarly, the source of transistors Q1 and Q15 is driven higher than a logical 1 to lessen the propagation delay through the device.

To sustain the high drive capacity of the circuit, the high voltage level at node D is selectively restored by $\phi 1$ through capacitor 6. As stated above, node D charges high upon the condition that node C and $\phi 2$ are high. Accordingly, parasitic gate-source capacitance of Q5 is charged. When $\phi 2$ goes off, $\phi 1$ goes on and the high level at node D is restored, thereby compensating for the intrinsic gate-source capacitance of Q5.

Figure 5:
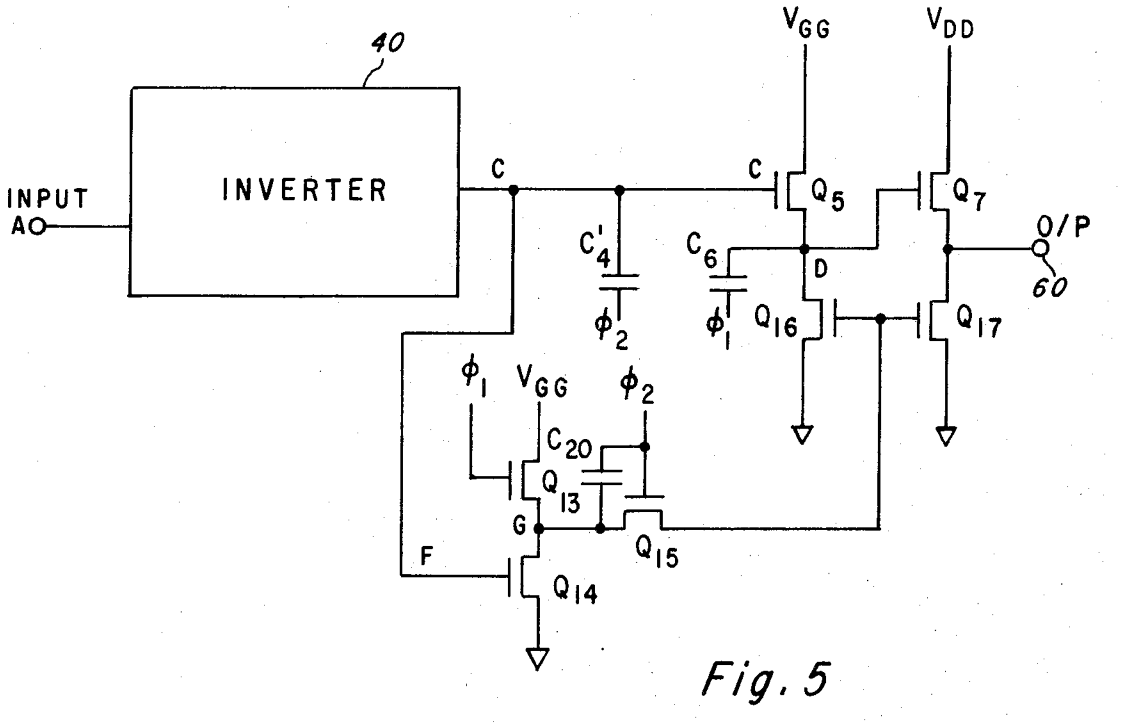
FIG. 5 schematically depicts an output buffer circuit in accordance with a second embodiment of the present invention.

FIG. 5 discloses an additional embodiment of the invention wherein said inverting delay amplifier 40 is utilized in said non-inverting delay amplifier 50. Referring to FIG. 1 IGFETs Q8, Q10 and Q11 are deleted, and node F is connected to the output of said inverter 40 at node C. Capacitor C'4 then represents the capacitors C4 and C12. The functional description of the preferred embodiment above is here applicable. This modification to the preferred embodiment allows more efficient operation by the elimination of the three active elements.

Figures 3A, 3B, 3C, 3D:
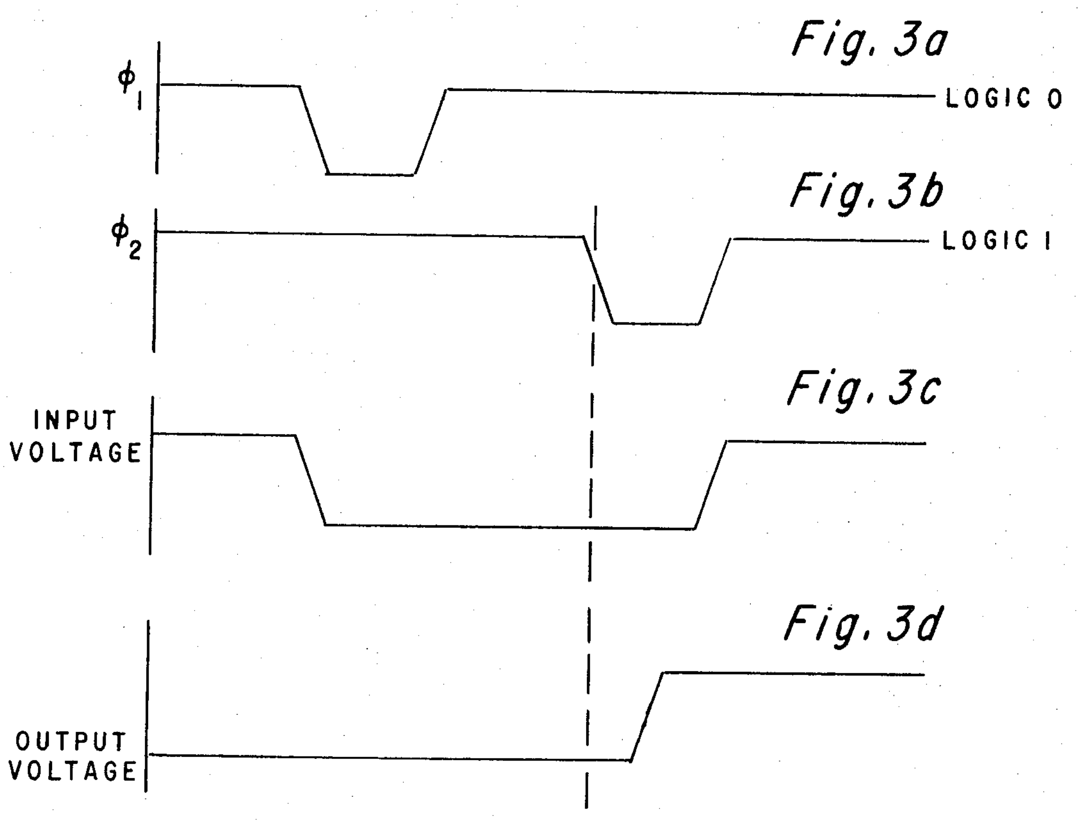
FIG. 3 shows typical waveforms associated with the invention.

FIG. 3 shows typical waveforms of $\phi 1$ and $\phi 2$ in time relationship to the input of 3*c* which results in the typical circuit output waveform of 3*d*. The output waveform is in accordance with conventional bipolar TTL requirements.

Figure 4:
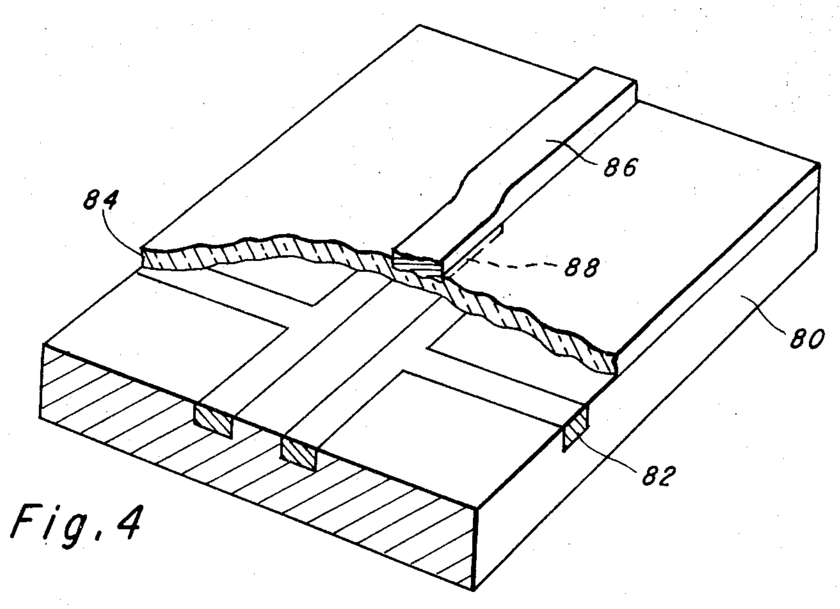
FIG. 4 is an isometric view of a section of an integrated circuit into which the output buffer circuit may be fabricated, with a partial cut-away of the insulating and metalization layers for graphic purposes.

With reference to FIG. 4 an integrated circuit implementation of the output buffer system of the present invention is shown. Assuming by way of illustration, that the transistors are to be p-channel devices an N-type substrate 80 having an appropriate resistivity is utilized. The substrate 80 may for example comprise N-type silicon having a donor concentration on the order of $10^{15}$ atoms/cc. By conventional masking and diffusion techniques, P-type dopants are diffused into the surface of the 80 to form conductors of P-type semiconductor materials as illustrated generally at reference numeral 82. In the areas where an IGFET is to be formed two parallel P-type regions are diffused into the substrate, respectively, forming the source and drain regions of the transistor. A layer of insulating material 84 is formed on the surface of the semiconductor substrate 80. This layer may, for example, comprise silicon dioxide having a thickness on the order of 10,000 A. To form the transistor, it is necessary that the thickness of the insulating layer 84 be reduced to, for example, about 500 A in the area overlying the substrate and between the two parallel diffused P-type regions which are to be used as the drain and source of the transistor. A conductive layer 86 is formed to overlie the insulating layer to form the gate terminal. The gate terminal as shown at 86 and the reduced area of the oxide is shown in the region 88. These operations may be performed using well known semiconductor processing techniques and are not described in detail herein. It is understood also, that N-channel devices may be formed and that various conductive layers for the gate such as silicon, aluminum, etc. and that various known insulating layers such as silicon dioxide, silicon nitride, combinations thereof, etc., may advantageously be utilized.

Although specific embodiments of this invention have been described herein various modifications to the details of construction will be apparent to those skilled in the art without departing from the scope of the invention.

What is claimed is:

1. An insulated gate field effect transistor output buffer circuit integrated on a semiconductor chip comprising:

a. first circuit means for receiving a logic input signal and operable to provide as an output the delayed complement of said logic input signal;
b. second circuit means for receiving said logic input signal and operable to provide an output that consists of said input signals delayed by a predetermined interval;
c. first and second IGFETs connected serially between circuit ground and a first voltage supply, respectively, having an output terminal at the common source-drain connection;
d. third and fourth IGFET connected in series between a second voltage source and circuit ground, respectively, having the gate of said fourth IGFET commonly connected to the gate of said first IGFET, the common source and drain being connected to the gate of said second IGFET, and the gate of said third IGFET being coupled to the output of said first circuit means; and
e. gating means coupling said delayed input signal to said common gates of said first and fourth IGFETs.

2. The output buffer circuit of claim 1 wherein said common source-drain connection of said third and fourth IGFET is coupled to a first clock signal by a capacitor.

3. The output buffer circuit of claim 2 wherein said gate of said third IGFET is coupled to a second clock signal by a capacitor.

4. The output buffer circuit of claim 3 wherein said first circuit means comprises an IGFET inverting delay circuit.

5. An output buffer circuit of claim 2 wherein said second circuit means comprises an IGFET non-inverting delay circuit.

6. The output buffer circuit of claim 3 wherein said gating means comprises an IGFET having its gate coupled to the output of said second circuit means by a capacitor.

7. The output buffer circuit of claim 6 wherein said first circuit means comprises:
a. sixth and seventh IGFETs connected in series between said second power supply and circuit ground, respectively, having gate of said sixth IGFET for receiving said third clock signal and having the common source-drain connection as output terminal; and
b. an eighth IGFET having its drain connected to said gate of said seventh IGFET, having its source connected to receive said data input signals, and having its gate for receiving said first clock signals, said source being coupled to said first clock by a capacitor.

8. The output buffer circuit of claim 7 wherein said second circuit means comprises:
a. ninth and tenth IGFETs connected in series between said second voltage supply and said first clock signal, respectively, having the gate of said ninth IGFET connected to said first clock signal and having an output connection at the common source-drain connection;
b. a capacitor connected between the gate of said tenth IGFET and said second clock signal;
c. eleventh and twelfth IGFETs connected in series between said second voltage supply and circuit ground, respectively, the gate of said eleventh IGFET being connected to said first clock signal, and the common source-drain connection being connected to said gate of said tenth IGFET:
d. a capacitor connected between the gate of said twelfth IGFET and said second clocking signal; and
e. a thirteenth IGFET having its drain connected to said gate of said twelfth IGFET, having its source for receiving said input signal, and having its gate connected to said first clock signal.

9. An insulated gate field effect transistor output buffer circuit integrated on a semiconductor chip comprising:
a. first circuit means for receiving a logic input signal and operable to provide as an output the delayed complement of said logic input signal
b. second circuit means for receiving said output of first circuit means and operable to provide an output that consists of said input signals delayed by a predetermined interval;
c. first and second IGFETs connected serially between circuit ground and a first voltage supply, respectively, having an output terminal at the common source-drain connection;
d. third and fourth IGFETs connected in series between a second voltage source and circuit ground, respectively, having the gate of said fourth IGFET commonly connected to the gate of said first IGFET, the common source and drain being connected to the gate of said second IGFET, and the gate of said third IGFET being coupled to the output of said first circuit means; and
e. gating means coupling said delayed input signal to said common gates of said first and fourth IGFETs.

10. The output buffer circuit of claim 9 wherein said common source-drain connection of said third and fourth IGFET is coupled to a first clock signal by a capacitor.

11. The output buffer circuit of claim 10 wherein said gate of said third IGFET is coupled to a second clock signal by a capacitor.

12. The output buffer circuit of claim 11 wherein said first circuit means comprises an IGFET inverting delay circuit.

13. The output buffer circuit of claim 12 wherein said second circuit means comprises an IGFET non-inverting delay circuit.

14. The output buffer circuit of claim 13 wherein said gating means comprises an IGFET having its gate coupled to the output of said second circuit means by a capacitor.

15. The output buffer circuit of claim 11 wherein said first circuit means comprises:
a. sixth and seventh IGFETs connected in series between said second power supply and circuit ground, respectively, having gate of said sixth IGFET for receiving said third clock signal and having the common source-drain connection as output terminal; and
b. an eighth IGFET having its drain connected to said gate of said seventh IGFET, having its source connected to receive said data input signals, and having its gate for receiving said first clock signals, said source being coupled to said first clock by a capacitor.

16. The output buffer circuit of claim 15 wherein said second circuit means comprises ninth and tenth IGFETs connected in series between said second voltage supply and said first clock signal, respectively, having the gate of said ninth IGFET connected to said first clock signal, having the gate of said tenth IGFET connected to said output of said first circuit means, and having the common source-drain connection as an output terminal.

17. The output buffer circuit of claim 4 wherein said predetermined interval of said second circuit means is one-half bit longer than the delay of said first circuit means.

18. The output buffer circuit of claim 9 wherein said predetermined interval of said second circuit means is one-half bit longer than the delay of said first circuit means.

* * * * *